United States Patent [19]

Chaillout et al.

[11] Patent Number: 5,225,778
[45] Date of Patent: Jul. 6, 1993

[54] OPTICAL PUMPING, RESONANCE MAGNETOMETER USING A SEQUENTIAL POLARIZATION

[75] Inventors: Jean-Jacques Chaillout, St Etienne de Crossey; Nelly Kernevez, Grenoble; Jean-Michel Leger, Meylan, all of France

[73] Assignee: Commissariat A l'Energie Atomique, Paris, France

[21] Appl. No.: 712,417

[22] Filed: Jun. 10, 1991

[30] Foreign Application Priority Data

Jun. 14, 1990 [FR] France .................. 90 07410

[51] Int. Cl.$^5$ ............................................. G01V 3/00
[52] U.S. Cl. ........................................ 324/304; 324/302
[58] Field of Search ............ 324/300, 302, 304, 305, 324/322, 318

[56] References Cited

U.S. PATENT DOCUMENTS

| | | | |
|---|---|---|---|
| 3,211,994 | 12/1965 | Colegrove et al. | 324/304 |
| 3,641,426 | 2/1972 | Brun et al. | 324/304 |
| 4,005,355 | 1/1977 | Happer et al. | 324/304 |
| 4,544,891 | 10/1985 | Kawacki | 324/304 |

FOREIGN PATENT DOCUMENTS

| | | |
|---|---|---|
| 0246146 | 5/1987 | European Pat. Off. |
| 0288927 | 11/1988 | European Pat. Off. |
| 964028 | 7/1964 | United Kingdom |

OTHER PUBLICATIONS

Revue de Physique Appliquee, vol. 5, No. 1, Feb. 1970, pp. 121-130; J. L. Meilleroux, Progres Recents sur le Magnetometre a Vapeur de Cesium Type "asservi".

*Primary Examiner*—Louis Arana
*Attorney, Agent, or Firm*—Oblon, Spivak, McClelland, Maier & Neustadt

[57] ABSTRACT

An improved optical pumping magnetometer with sequential polarization for measurement of weak magnetic fields involves a device which sequentially modifies the polarization either in the direction of the polarization or from clockwise to counterclockwise circular polarization. As a result of the sequential modification of the polarization, the magnetometer for measurement of the weak magnetic fields has excellent isotropy while still retaining a simple construction and a small overall dimension to the device by using only a single cell.

13 Claims, 4 Drawing Sheets

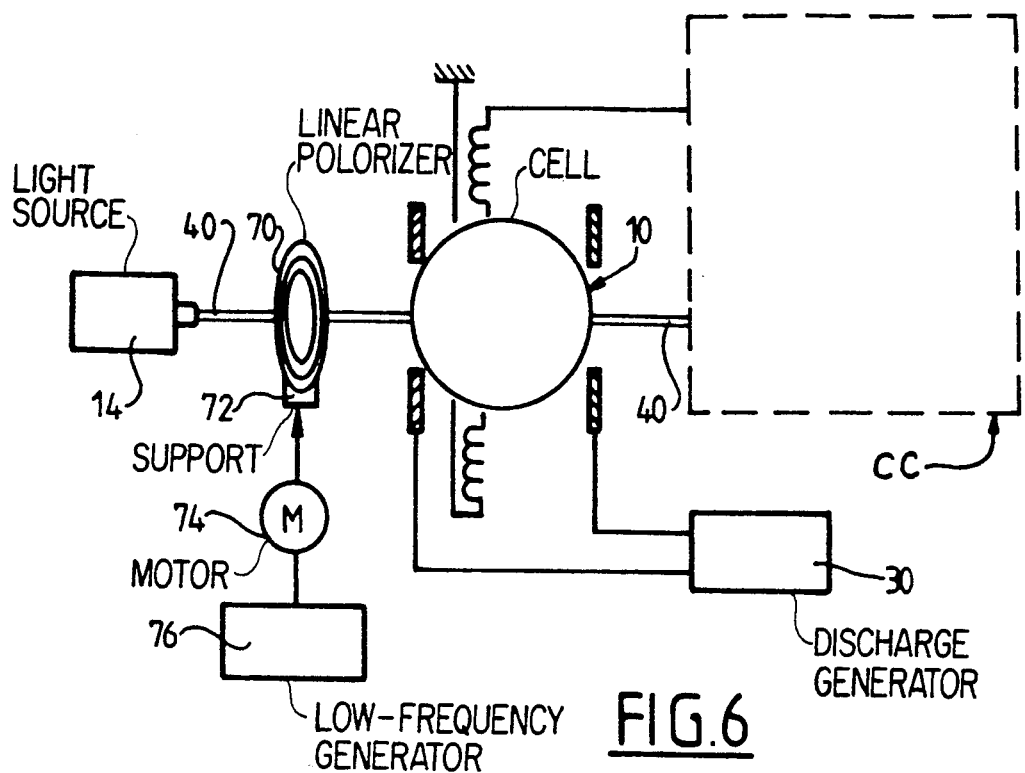
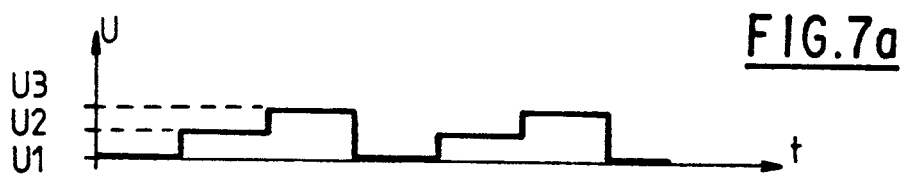
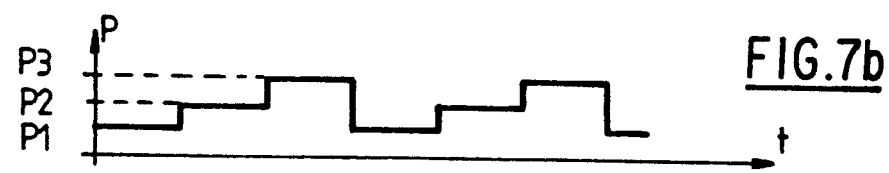
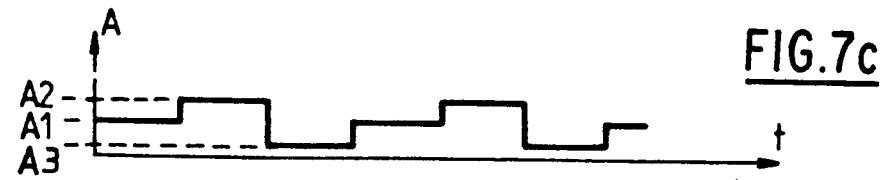
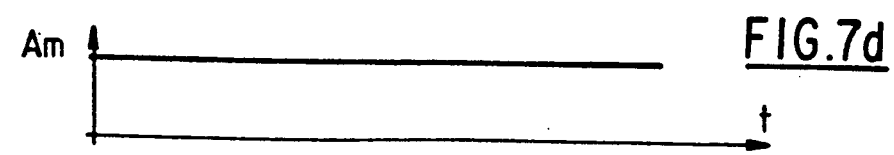

OPTICAL PUMPING, RESONANCE MAGNETOMETER USING A SEQUENTIAL POLARIZATION

BACKGROUND OF THE INVENTION

The present invention relates to a magnetometer. It is used in the precise measurement of weak magnetic fields (typically in the range 20 to 70 μT corresponding to the values of the earth's magnetic field).

The magnetometer according to the invention is of the so-called resonance magnetometer type and a general description thereof is provided in the article by F. HARTMAN entitled "Resonance Magnetometers", published in the journal "IEEE Transactions of Magnetics", vol. MAG-8, No. 1, March 1972, pp 66 to 75.

A resonance magnetometer is an apparatus which, immersed in a magnetic field Bo, supplies an electrical signal of frequency F, whose value is linked with Bo by the so-called LARMOR relation:

$F = \gamma Bo$ in which $\gamma$ is the gyromagnetic ratio (of an electron or nucleon as a function of the substance used). For example, for the electron, said ratio is 28 Hz/nT.

In the case of such equipment, the optical pumping magnetometer occupies a privileged position. The general construction of a magnetic resonance, optical pumping magnetometer is diagrammatically shown in FIG. 1.

An at least partly transparent cell 10 is filled with a gas 12, generally helium at a pressure of 1-to a few Torr. A light source 14 supplied a light beam 18, whose wavelength is approximately 1.1 μm in the case of helium. This beam is appropriately polarized by a means 16 and then injected into the cell 10.

In addition, a so-called weak or gentle radiofrequency or high frequency discharge is produced in the gas by a generator 30 connected to two electrodes 32, 33 arranged around the cell 10. This discharge produces atoms in a metastable state ($2^3S_1$ in the case of helium). The incident light beam 18 "pumps" these atoms from the metastable state to bring them into another excited state ($2^3P$).

In the presence of a magnetic field Bo, the energy levels are subdivided into sublevels, called ZEEMAN sublevels. A resonance between such sublevels can be established by a high frequency field (magnetic resonance) or by a modulation of the light (double optical resonance; COHEN, TANNOUDJI, Ann. Phys., 7, 1962, p 423). In the case of isotope 4 helium, the resonance is established between two electronic ZEEMAN sublevels of the metastable state. This resonance is revealed by various known electronic means, whereof one variant is shown in FIG. 1. It is a winding 20 positioned on either side of the cell 10 (in a so-called HELMHOLTZ arrangement), a high frequency generator 22 and a photodetector 24 receiving the light radiation which has passed through the cell, an amplifier 25, a synchronous detection means 21 and an integrator 23. All these means 21 to 26 will be referred to hereinafter by the reference CC. The generator 22 supplies the winding 20 with current at the frequency F, which creates an oscillating magnetic field, whereof one component maintains the resonance and on return modulates the light beam which is passed through the cell, said modulation constituting the signal. It is revealed by the synchronous detection at the output of the photodetector, via the amplifier. The reference is given by the generator. The output of the synchronous detection means corresponding to the component of the signal in phase with the reference serves as an error signal and the integrator eliminates its static error. This error signal readjusts the frequency F of the synthesizer to the LARMOR frequency. For this purpose the synthesizer must be voltage-controllable and it can also be replaced by a voltage-controlled oscillator (V.C.O.).

Thus, an electric resonance signal is established in said loop at the LARMOR frequency. A frequency meter 26 gives it the value F. The field to be measured Bo is deduced by the relation Bo = F/$\gamma$. Helium magnetometers of this type firstly used helium lamps. The recent availability of lanthanum-neodymium aluminate (or LNA) crystals has made it possible to produce lasers tunable about the wavelength of 1.083 μm precisely corresponding to the optical pumping line of helium. Therefore this type of laser has naturally taken the place of these lamps and has led to a significant performance improvement, so that interest has been reawakened in such equipment. Such a magnetometer equipped with a LNA laser is described in FR-A-2 598 518.

Although satisfactory in certain respects, such magnetometers still suffer from disadvantages. Thus, by their very nature, they are highly anisotropic, both in amplitude and frequency. Signal suppressions occur for certain orientations of the magnetic field to be measured. These unfavourable orientation correspond either to certain propagation directions of the light beam (in the case of a circular polarization), or to certain polarization directions (in the case of a linear polarization). Optical pumping then no longer produces the requisite polarization of the ZEEMAN sublevels of the atoms, or the detection of the resonance proves to be ineffective.

Various solutions have been proposed for obviating this disadvantage. For example, the US company Texas Instruments recommends the use of several cells oriented in such a way that at least one supplies a usable signal. The Canadian company Canadian Aviation Electronics recommends orienting the magnetometer in an appropriate manner with respect to the field to be measured.

As the suppression zones of the signal are more extensive for a linearly polarized beam than for a circularly polarized beam, preference is generally given to working with circular polarization. However, with this type of polarization, a frequency shift phenomenon occurs due to the optical pumping and this gives rise to measurement errors.

Texas Instruments obviates this disadvantage by doubling the number of cells and by making one of them operate with clockwise circular polarization and the other with anticlockwise circular polarization. The frequency shifts observed in the two cells then have opposite signs and a compensation is possible by forming the mean of the two measured frequencies.

All these solutions, which amount to increasing the number of apparatuses, are not very satisfactory, due to excessive overall dimensions, the need to balance the various measuring channels, the control of the orientation of the cells, high power consumption, etc. Moreover, any installation must be produced in an amagnetic environment, which causes serious technological problems.

SUMMARY OF THE INVENTION

The present invention aims at obviating these disadvantages. For this purpose it proposes an optical pumping, resonance magnetometer, whose isotropy is excellent, but whilst still having a simple construction, small overall dimensions (only comprising a single cell) and which is easy to realize.

This objective is achieved by the invention through the use of means able to sequentially modify the polarization of the light beam injected into the cell. The plurality of polarizations used leads to the obtaining of a plurality of components for the resonance signal, said components to a greater or lesser extent being attenuated and/or suffering from error (as a function of the orientation of the field to be measured compared with the polarization used). It is still possible to extract from these components a measurement signal free from these defects. Thus, it is possible to extract a significant signal from the magnetometer, no matter what the orientation of the magnetic field to be measured.

According to a first variant of the invention, working takes place with circular polarization. The means for sequentially modifying the polarization of the light beam make it alternately pass from a clockwise to an anticlockwise circular polarization. The electrical resonance signal then alternately has two different frequencies corresponding to the two opposite sign errors in circular polarization, in the manner described hereinbefore. The processing means for such a signal are able to form the mean of these two frequencies, said mean being free from any measurement error.

According to a second variant of the invention, linear polarization is used. The means for sequentially modifying the polarization then successively give the same a direction in any one of n different directions, n being an integer at least equal to 2, e.g. 3.

The means for detecting the resonance signal then supply a plurality of n signals having the same frequency, but different amplitudes. Those signals corresponding to polarization directions not very favourable with respect to the direction of the field to be measured have low or even zero amplitudes. However, due to the variety of polarization directions used, there are necessarily more favourable polarization directions, which lead to more intense signals.

In this variant using linear polarization, two embodiments are provided:

the first consists of forming the mean of the amplitudes of the plurality of n signals obtained, said mean necessarily exceeding the smallest of the amplitudes obtained, so that the measurement signal always exceeds the signal which would be supplied by a magnetometer placed under the least favourable conditions;

the second consists of comparing the amplitude of the resonance signal obtained with one of the polarization directions having a nominal value and if this amplitude is below the nominal value, the polarization direction continues to be sequentially modified and as soon as one of the amplitudes exceeds the nominal value, the direction modification is stopped and the polarization direction corresponding to said amplitude is maintained.

All these arrangements apply to optical pumping, resonance magnetometers, no matter what the pumped medium. Naturally, in the present state of the art, preference is attached to helium. However, other known gases or fluids are not excluded from the invention, such as e.g. alkali metal vapours (cesium, rubidium, etc.). The resonance can be magnetic (excitation by a high frequency field) or optical (modulation of light, optical multiresonance).

In the same way, although preference is attached to the LNA laser in the pumping of helium cells, the invention is not limited to this source and any magnetometer using a random light source forms part of the invention if it operates sequentially in polarization.

BRIEF DESCRIPTION OF THE DRAWINGS

The invention is described in greater detail hereinafter relative to non-limitative embodiments and with reference to the attached drawings, wherein show:

FIG. 6 A magnetometer in a variant having linear polarization with direction changes.

FIGS. 7a–7d A diagram showing the plurality of polarization directions and the corresponding filtered signal.

DETAILED DESCRIPTION OF THE INVENTION

Figure 1:
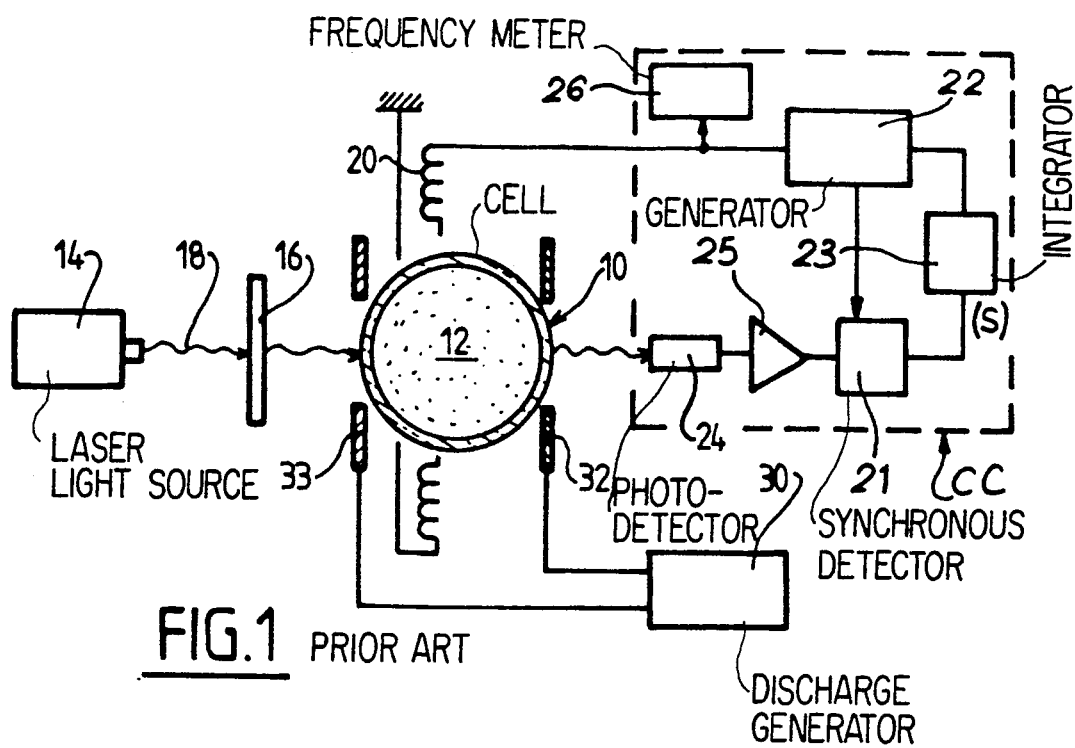
FIG. 1, already described, a prior art magnetometer.
Figure 2:
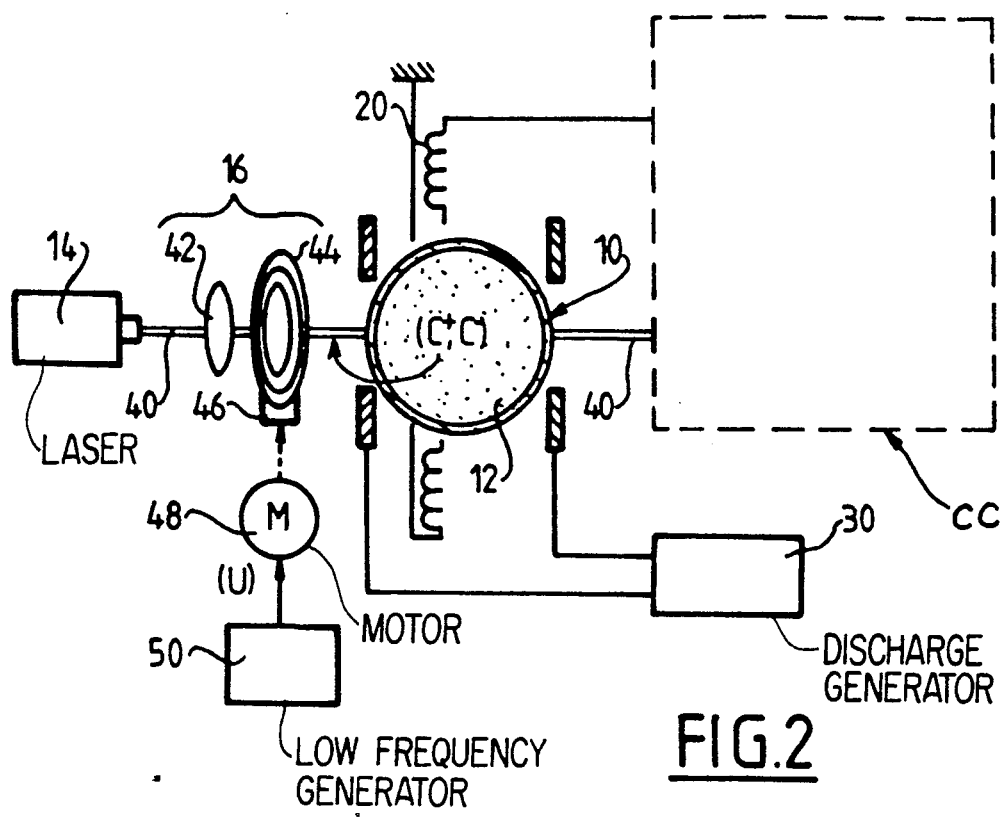
FIG. 2 An embodiment of a magnetometer according to the invention, in a circular polarization variant.

The magnetometer shown in FIG. 2 comprises the means already illustrated in FIG. 1 and which therefore carry the same reference numerals. They are the helium-filled cell 10, the laser 14, the polarization means 16, the winding 20, the circuit CC (incorporating the resonance exciting circuit 22, the photodetector 24, the frequency meter 26, the amplifier 25, the synchronous detection means 21 and the integrator 23) and the discharge generator 30. According to a first variant of the invention, the polarization means 16 comprises a linear polarizer 42 and a circular polarizer 44. The latter is mounted on an orientable support 46 able to tilt the polarizer 44 by 90°. A motor 48 acts on the support 46 and is controlled by a low frequency generator 50.

As shown in FIG. 2, the magnetometer comprises optical fibres 40 for guiding the light between the laser 14 and the photoreceiver 24. This arrangement is advantageous, but not obligatory.

Figure 3:
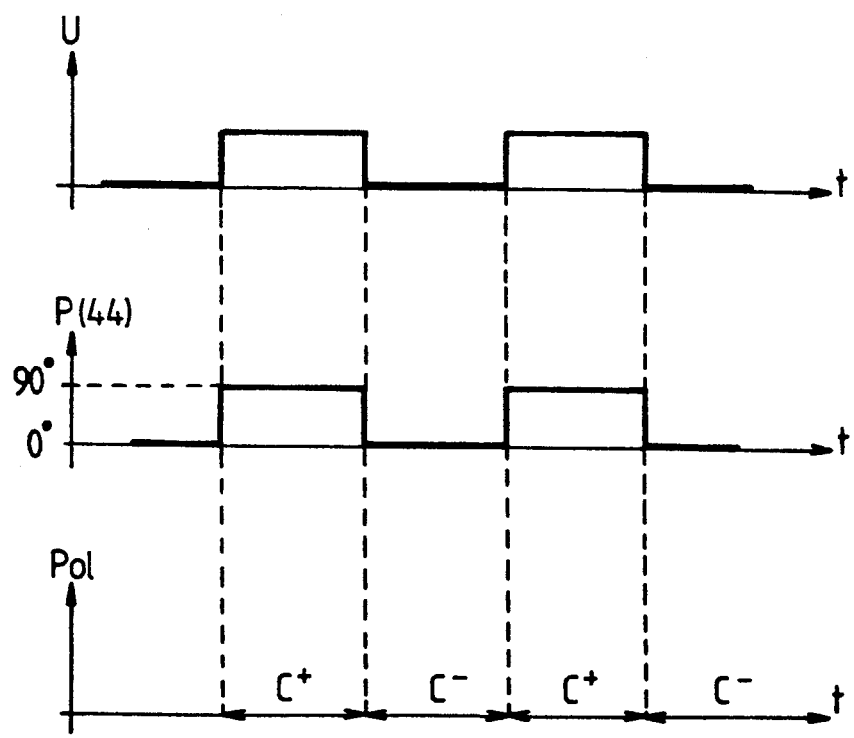
FIG. 3 An explanatory diagram of the different circular polarizations used.

The first line of the diagram of FIG. 3 shows the shape of the voltage U supplied by the generator 50. This voltage is in square-wave form. The position of the polarizer 44 is illustrated in the second line. It is sometimes parallel to a reference direction designated 0° and sometimes at 90° therefrom. In the third line, it is possible to see the succession of polarizations resulting therefrom for the light beam injected into the cell and which is alternately clockwise circular ($C^+$) and anticlockwise circular ($C^-$).

Naturally, if the light source 14 emits an already linearly polarized beam, as is sometimes the case with lasers, the linear polarizer 42 fulfils no function.

Figure 4:
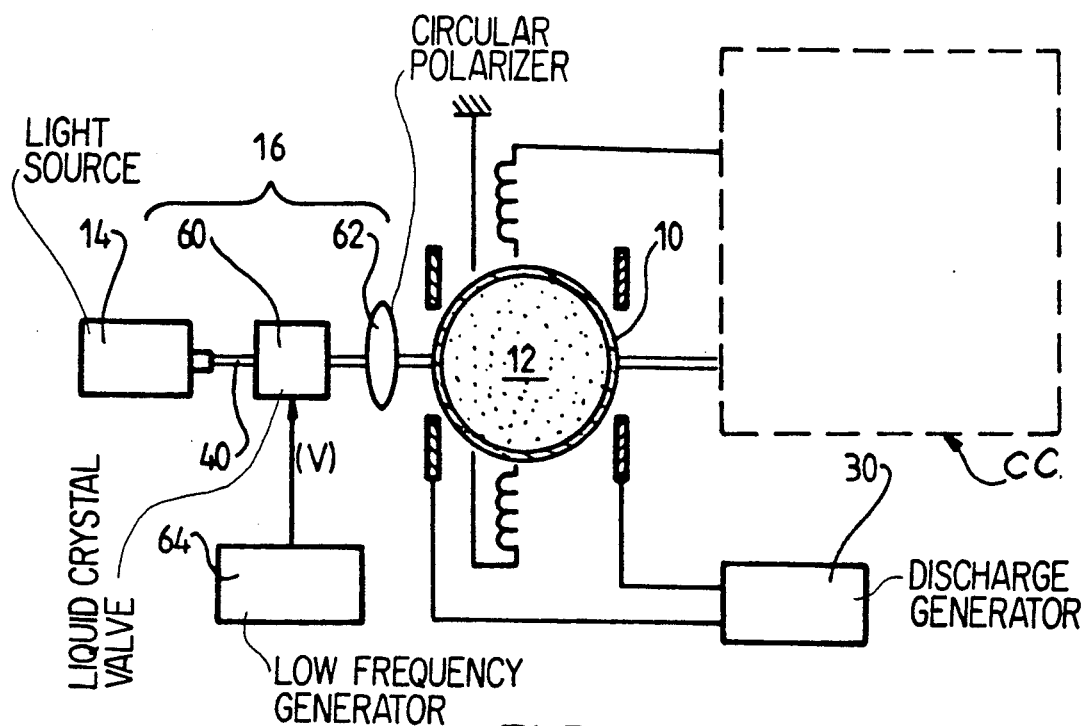
FIG. 4 Another embodiment, still in the circular polarization variant.

The Expert can easily conceive other embodiments of the means making it possible to pass from a clockwise to an anticlockwise circular polarization. Thus, FIG. 4 shows an embodiment using a liquid crystal valve 60 associated with a fixed circular polarizer 62. The valve 60 is controlled by a low frequency generator 64.

When the voltage applied is zero, the crystals are oriented in accordance with their ordinary axis. When the voltage is nominal (V), the crystals are oriented in accordance with their extraordinary axis (the axes are perpendicular to that of the propagation of the beam). The linear polarization leaving the valve tilts by 90°. On leaving the circular polarizer, the beam is circularly polarized alternately to the right and left. The advantage of this embodiment is that no moving part is required. The polarization of the beam in front of the valve must make it possible to supply the light power in two polarization directions. This can be carried out at the output of an optical fibre, which depolarizes the beam and distributes the power in the polarization space.

Figure 5:
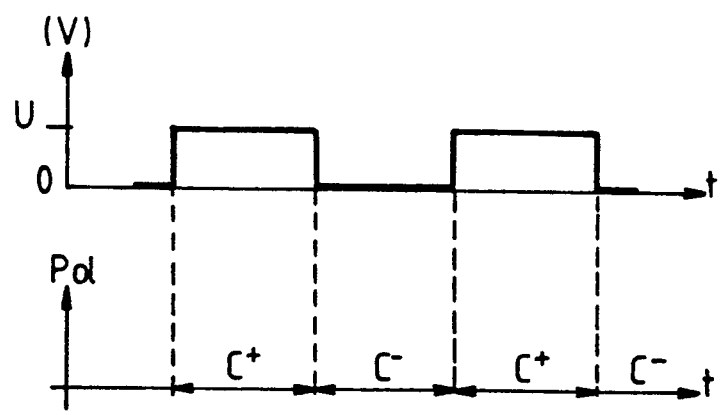
FIG. 5 An explanatory diagram of the different circular polarizations used.

This mechanism is illustrated in FIG. 5. In this variant of the invention with reversal of the circular polarization direction, the sign of the frequency error reverses at each direction change. If the reversal is carried out at a sufficiently high frequency (well above 1 Hz), it will not be observed, because it will be filtered by low-pass filters (first or second order) or by phase feedback loops used in the detection of the signal, so that the averaged error is zero at the output of the photodetector 24.

Other electrooptical devices can be used in place of the liquid crystal valve (solid electrooptical crystal cells, etc.).

Figure 8:
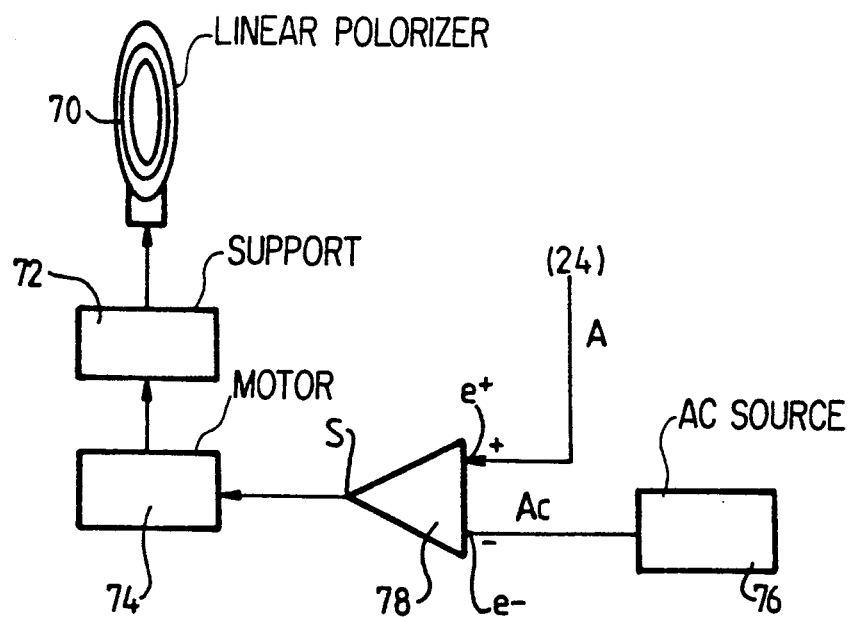
FIG. 8 A comparison embodiment.

According to a second variant of the invention illustrated in FIGS. 6 to 8, working takes place with linear polarization. In the embodiment illustrated in FIG. 6, a linear polarizer 70 is mounted on an orientable support 72 and can assume n positions (e.g. 3). These positions define n directions between 0° and 90° arranged at 90°/n−1 from one another (e.g. 3 positions at 0°-45°-90°). The position of the support is controlled by a motor 74, which is itself controlled by a low frequency generator 76.

The diagram of FIG. 7 shows the three voltages U1, U2, U3 sequentially applied to the motor (top line) and the three corresponding directions P1, P2, P3 taken by the polarization (second line).

As a function of the direction taken by the polarization, the angle between said direction and the magnetic field to be measured is more or less favourable and the amplitude of the resonance signal more or less large. The three amplitudes A1, A2, A3 of the resonance signal are represented on the third line.

If the polarization direction change takes place at a sufficiently fast frequency (well above 1 Hz), a filter 27 located at the output of the resonance signal detection means will filter the detected signal and supply a mean signal (bottom line of FIG. 7). The amplitude of this signal is relatively independent of the direction of the magnetic field and the magnetometer is quasi-isotropic.

The choice of the number n of polarization directions is dependent on the sought isotropy. With n=3 for a transverse magnetic direction, an isotropy of more than 50% is obtained (the isotropy being defined as the ratio between the minimum amplitude obtained in the least favourable case and the maximum amplitude obtained in the most favourable case).

According to an embodiment illustrated in FIG. 8, the magnetometer comprises a means 76 able to supply a nominal value Ac, a comparator 78 receiving on a first input e+ the amplitude A of the detected signal and on a second input e− the nominal value Ac. This comparator 78 has an output s connected to the motor 74.

The logic state of this output (e.g. 1), obtained when the measured amplitude A is below the nominal value Ac has the effect of controlling the application to the motor of a voltage able to modify the polarization direction. The appearance of the other logic state on said output (0), when the measured amplitude A exceeds the nominal value Ac has the effect of stopping the control of the motor, so that the corresponding linear polarization is maintained.

We claim:

1. An optical pumping resonance magnetometer comprising:

a cell filled with a gas whose atoms have a gyromagnetic ratio $\gamma$;

a light source emitting a light beam;

a polarizer transversed by said beam and being subsequently injected into said cell for optically pumping said gas;

detection means for detecting an electrical resonance signal at a Larmor frequency $F=\gamma B_0$, in which $B_0$ is an ambient magnetic field in which said cell is immersed and wherein said ambient magnetic field is a field to be measured;

means for measuring said Larmor frequency, wherein the amplitude of said ambient magnetic field is determined from said frequency by the relation $B_0=F/\gamma$;

said magnetometer further comprising a means for sequentially modifying the polarization of said light beam injected into said cell whereby said detected electrical resonance signal consequently has a plurality of components; and sequential signal processing means for processing said plurality of components in order to extract from said components an overall ambient magnetic field measurement signal.

2. Magnetometer according to claim 1 wherein the optical beam injected into the cell has a circular polarization, wherein the means for sequentially modifying the polarization of the light beam pass the polarization alternately from a clockwise circular polarization (C+) to an anticlockwise circular polarization (C−), the resonance signal detection means then supplying two signals of different frequencies and the sequential signal processing means are able to measure the mean value (Im) of the two frequencies obtained.

3. Magnetometer according to claim 2, wherein the means for sequentially modifying the polarization of the beam into a clockwise or anticlockwise circular polarization comprise a circular polarizer receiving a light beam with a linear polarization, said circular polarizer being located on an orientable support a motor for tilting the polarizer by 90° and a low frequency generator for controlling the motor.

4. Magnetometer according to claim 2, wherein the means for sequentially modifying the polarization of the beam into a clockwise and anticlockwise circular polarization comprises an electrooptical device supplying a beam with a linear polarization directed in one or other of two rectangular directions, a low frequency generator for controlling the electrooptical device and a circular polarizer receiving the beam supplied by the electrooptical device.

5. Magnetometer according to claim 4, wherein the electrooptical device is a liquid crystal cell.

6. Magnetometer according to claim 1, wherein the optical beam injected into the cell has a linear polarization, and wherein the means for sequentially modifying the polarization successively provides said linear polarization with an orientation in n different directions, n being at least equal to 2, the resonance signal detecting means subsequently supplying a plurality of n signals which differ from one another by their amplitude.

7. Magnetometer according to claim 6, furthermore comprising following the detection means and before the frequency measuring means, a means able to form the mean of the n detected signals.

8. Magnetometer according to claim 6, further comprising a means able to supply a nominal value (Ac), a comparator receiving on a first input (e+) the amplitude (A) of the detected signal and on a second input (e−) the nominal value (Ac), said comparator having an output (s) connected to the motor, the logic state of said output (s), obtained when the measured amplitude (A) is below the nominal value (Ac), controlling the motor for the sequential modification of the polarization direction and the logic state of said output (s), obtained when the measured amplitude (A) exceeds the nominal value (Ac) stops the motor.

9. Magnetometer according to any one of the claims 6 to 8, wherein the means for sequentially modifying the linear polarization comprises a linear polarizer mounted on an orientable support, a motor able to successively tilt the polarizer by 90°/n−1 up to the return to 0° and a low frequency generator for controlling the motor.

10. Magnetometer according to any one of the claims 1 or 2 to 8 wherein the gas in the cell is helium.

11. Magnetometer according to claim 10, further comprising means for creating a high frequency discharge in the helium cell.

12. Magnetometer according to any one of the claims 1 or 2 to 8 wherein the light source is a laser.

13. Magnetometer according to any one of the claims 1 or 2 to 8 wherein the light beam is guided between the source and the cell on the one hand and between the cell and a photodetector on the other by an optical fibre.

* * * * *